United States Patent [19]
Lin

[11] Patent Number: 5,943,598
[45] Date of Patent: Aug. 24, 1999

[54] INTEGRATED CIRCUIT WITH PLANARIZED DIELECTRIC LAYER BETWEEN SUCCESSIVE POLYSILICON LAYERS

[75] Inventor: Yih-Shung Lin, Singapore, Singapore

[73] Assignee: STMicroelectronics, Inc., Carrollton, Tex.

[21] Appl. No.: 08/545,388

[22] Filed: Oct. 19, 1995

[51] Int. Cl.$^6$ ................................................ H01L 21/44
[52] U.S. Cl. .......................... 438/618; 438/620; 438/488
[58] Field of Search ..................... 174/250, 255, 174/261, 262, 264; 361/765, 761, 762, 764, 795, 792, 311, 312, 313, 320, 321.1, 321.2, 321.3, 321.4, 321.5; 437/182, 203, 195, 191, 193; 257/756, 752, 754, 755, 412, 413; 438/618, 620, 479, 488

[56] References Cited

U.S. PATENT DOCUMENTS

| | | | |
|---|---|---|---|
| 5,396,034 | 3/1995 | Fujita et al. | 174/261 |
| 5,432,677 | 9/1995 | Mowatt et al. | 361/719 |
| 5,494,859 | 2/1996 | Kapoor | 437/235 |
| 5,524,339 | 6/1996 | Gorowitz et al. | 29/841 |
| 5,578,796 | 11/1996 | Bhatt et al. | 174/260 |
| 5,684,312 | 11/1997 | Yonemoto | 257/291 |

FOREIGN PATENT DOCUMENTS

| | | | |
|---|---|---|---|
| 6-53328 | 2/1994 | Japan | 257/756 |

OTHER PUBLICATIONS

"Techniques for Planarizing Device Topology," Kathy Sidmore, Associate Editor, Apr. 1988 Semiconductor International, pp. 5, 115–119.

"Silicon Processing for the VLSI Era, vol. 1: Process Technology,"Stanley wolf and Richard N. Tauber, Chapter 6: Chemical Vapor Deposition of Amorphous and Polycrystalline Thin Filmes, pp. 161, 182–197, Lattice Press, Sunset-Beach, California, 1986.

Primary Examiner—Dean A. Reichard
Assistant Examiner—William Silverio
Attorney, Agent, or Firm—Theodore E. Galanthay; Lisa K. Jorgenson; Renee M. Larson

[57] ABSTRACT

A method of forming a portion of a semiconductor integrated circuit having a semiconductor substrate as well as the resulting integrated circuit. In the inventive method, various steps are involved. In one embodiment, for example, the method steps are as follows. First, there is formed a first polysilicon layer overlying and in contact with the semiconductor substrate. Second, a plurality of conductive structures are patterned from the first polysilicon layer. Third, there is formed a dielectric layer having an upper planar surface and having a lower surface contacting the semiconductor substrate and the plurality of conductive structures from the first polysilicon layer. Fourth, there is formed a second polysilicon layer overlying and in contact with the dielectric layer. Fifth, a plurality of conductive structures are formed from the second polysilicon layer. Lastly, there is formed a metallic layer over the plurality of conductive structures from the second polysilicon layer.

19 Claims, 3 Drawing Sheets

INTEGRATED CIRCUIT WITH PLANARIZED DIELECTRIC LAYER BETWEEN SUCCESSIVE POLYSILICON LAYERS

This invention relates to integrated circuits, and is more particularly directed to an integrated circuit with a planarized dielectric layer between successive polysilicon layers.

BACKGROUND OF THE INVENTION

Integrated circuits continue to increase in size, use, and complexity. For example, integrated circuit memories are used in business and personal devices. With each of the above factors, there is an ongoing need to design and manufacture such integrated circuits as efficiently as possible, minimizing cost and size while maximizing reliability. The present invention balances each of these goals in the context of an integrated circuit having numerous polysilicon layers and at least one metal layer, all of which are typically separated by respective dielectric layers.

Current static random access memory ("SRAM") integrated circuits are constructed in the manner set forth above, that is, with numerous layers of polysilicon, dielectric, and/or metal. As known in the art, the successive polysilicon and/or metal layers are often referred to with corresponding numeric references so as to distinguish successive layers as they rise in ascending fashion from the underlying semiconductor substrate. Thus, the polysilicon layer which is first encountered but over the semiconductor substrate is often referred to as a "poly-1" layer, while the polysilicon layer which is second encountered and over the semiconductor substrate and the poly-1 layer is often referred to as a "poly-2" layer, and so forth. As the number of polysilicon, dielectric, and/or metal layers increases, so does the complexity of design rules. The design rules also relate to other features, such as the decreasing size of gate conductors, variations in fabrication processes, and other considerations known in the art.

Given the above backdrop, FIGS. 1a through 1c illustrate a cross-sectional view of a prior art method of fabricating an integrated circuit which further demonstrates certain problems recognized by the inventor of the present invention. Turning first to FIG. 1a, the structure shown in that figure depicts a portion of an integrated circuit that has been partially fabricated, and which includes a silicon substrate 10 with a surface 10a. Further, field oxide regions 12a, 12b, and 12c are formed along surface 10a. Various items may be formed by a poly-1 layer on surface 10a. For example, in FIG. 1a, a first transistor gate 14a is formed on surface 10a between regions 12a and 12b, and a second transistor gate 14b is formed on surface 10a between regions 12b and 12c. Transistor gates 12a and 12b are formed as known in the art, and may include capping layers as part of the gate structure. In addition to poly-1 structures on surface 10a, other items may be formed by portions of the poly-1 layer overlying the field oxide regions. For example, a conductor 14c is formed immediately overlying field oxide region 12c. Each of items 14a through 14c are formed by depositing the poly-1 layer and etching according to known techniques. In addition, note that when used throughout this document, the "poly" layers may be formed by polysilicon, or may be polycides, that is, the combination of polysilicon and a refractory metal silicide.

With further reference to FIG. 1a, an interlevel dielectric layer 16 is formed over the structures described above. Typically, dielectric layer 16 is a deposited oxide on the order of 900 to 3,000 angstroms in thickness. After dielectric layer 16 is formed, holes are formed through that layer, typically using standard masking and etching techniques. For purposes of illustration, the locations of these holes are shown using vertical dotted lines in layer 16, and are numbered 18a through 18e. Holes 18a through 18e are commonly on the order of 0.5 microns in diameter. As described later, holes 18a through 18e are thereafter filled with conductive material so electrical contact may be made to the component underlying the hole. For example, a conductive contact may be formed through hole 18a to surface 10a so that electrical contact may be made to the diffused region (not specifically shown) immediately to the side of first transistor gate 14a.

FIG. 1b illustrates the electrical contacts 20a through 20e through dielectric layer 16 as described above. Contacts 20a through 20e are formed first by depositing a conductive layer and second by selectively etching that layer to form the desired size and shape of the contacts. Particularly, a blanket poly-2 layer is formed using a chemical vapor deposition ("CVD") technique. Typically, the CVD layer is conformal and its thickness is selected to fill the largest diameter among holes 18a through 18e. Thereafter, the CVD layer is patterned and etched using known techniques. With specific reference to the contacts, FIG. 1b includes poly-2 contacts 20a through 20e formed in holes 18a through 18e, respectively, from FIG. 1a. In the current example, contacts 20a through 20e form electrical points to be contacted by subsequent conductive layers. In addition, poly-2 may be used to form "landing pads" as that term is known in the art. Note further that contacts 20d and 20e are also connected to one another, thereby forming a so-called local interconnect as known in the art.

With further reference to FIG. 1b, a planarized dielectric layer 22 is formed over the structures described above, including the poly-2 contacts 20a through 20e. Note that while dielectric layer 22 covers two polysilicon layers, in many current instances a poly-3 layer (and an additional interlevel oxide layer) is also included before a layer such as dielectric layer 22 is formed. Thus, in common prior art situations, the formation of a planarized dielectric layer does not occur until after the final polysilicon layer is already formed, particularly in the formation of static random access memories.

Returning to dielectric layer 22, that layer is typically an oxide on the order of 5,000 to 10,000 angstroms in thickness. After dielectric layer 22 is formed, holes are formed through that layer, again using standard masking and etching techniques. For purposes of illustration, the locations of these holes are shown using vertical dashed lines in layer 22, and are numbered 24a through 24d. Holes 24a through 24d are commonly on the order of 0.5 microns in diameter.

FIG. 1c illustrates the electrical contacts through dielectric layer 22. Particularly, holes 24a through 24d are commonly filled with a metal so electrical contact may be made to the component underlying the hole. For example, a metal layer 26 is formed overlying the structure of FIG. 1b, thereby filling holes 24a through 24d described in connection with FIG. 1b. As a result, metal layer 26 provides electrical interconnection to the components contacted within holes 24a through 24d.

To better appreciate the invention described below, various points are set forth here with respect to FIGS. 1a through 1c. First, note that the length of holes 24a through 24d, as defined through layer 22, differs because the vertical height of the various contact areas differ; for example, contact pad 20a is vertically lower than is contact pad 20b. Consequently, hole 24a extends farther through dielectric layer 22 than does holes 20b. Second, holes 24a through 24d have a high aspect ratio (i.e., the ratio of the hole length relative to its diameter). Third, as known in the art, holes with higher aspect ratios increase design complexity for subsequent layers. For example, when metal layer 26 is applied to the high aspect ratio holes, layer 26 must be sufficiently thick in order to fully fill those holes. In other words, a relatively deep and narrow hole creates additional design complexities, but this must be addressed, particularly to form a sufficient barrier against silicon and metal inter-diffusion.

It is therefore an object of the present invention to provide an integrated circuit with a planarized dielectric layer between successive polysilicon layers which overcomes and improves upon the disadvantages and drawbacks of the prior art.

It is a further object of the present invention to provide such an integrated circuit which reduces the aspect ratio of holes having a metal passing through those holes.

It is a further object of the present invention to provide such an integrated circuit which decreases design complexity for the circuit.

It is a further object of the present invention to provide such an integrated circuit which provides an improved formation of the metalization layer within contact holes as compared with the prior art.

It is a further object of the present invention to provide such an integrated circuit which may be used in constructing a static random access memory.

Still other objects and advantages of the present invention will become apparent to those of ordinary skill in the art having references to the following specification together with its drawings.

SUMMARY OF THE INVENTION

In the preferred embodiment, the present invention includes a method of forming a portion of a semiconductor integrated circuit having a semiconductor substrate as well as the resulting integrated circuit. In the inventive method, various steps are involved. In one embodiment, for example, the method steps are as follows. First, there is formed a first polysilicon layer overlying the semiconductor substrate. Second, a plurality of conductive members are patterned from the first polysilicon layer. Third, there is formed a dielectric layer having an upper planar surface and having a lower surface contacting the semiconductor substrate and the plurality of conductive members from the first polysilicon layer. Fourth, there is formed a second polysilicon layer overlying and in contact with the dielectric layer. Fifth, a plurality of conductive members are formed from the second polysilicon layer. Lastly, there is formed a metallic layer over the plurality of conductive members from the second polysilicon layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
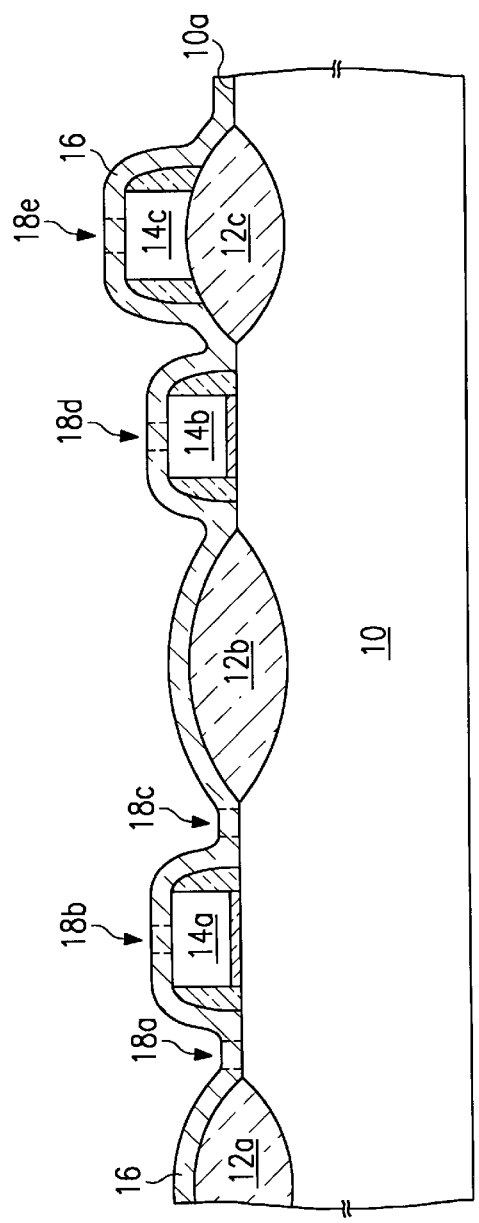
FIG. 1a illustrates a cross-sectional view of a prior art semiconductor substrate having poly-1 devices formed on the surface of the substrate.
Figure 1B:
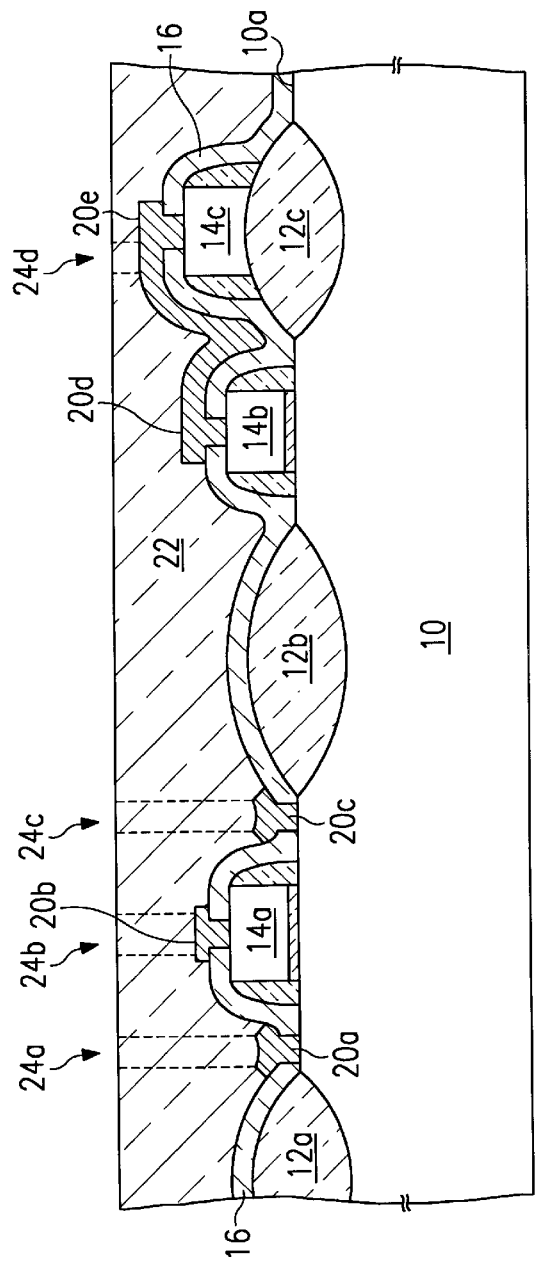
FIG. 1b illustrates a cross-sectional view of the prior art semiconductor substrate of FIG. 1a and further including poly-2 devices and a planarized dielectric layer.
Figure 1C:
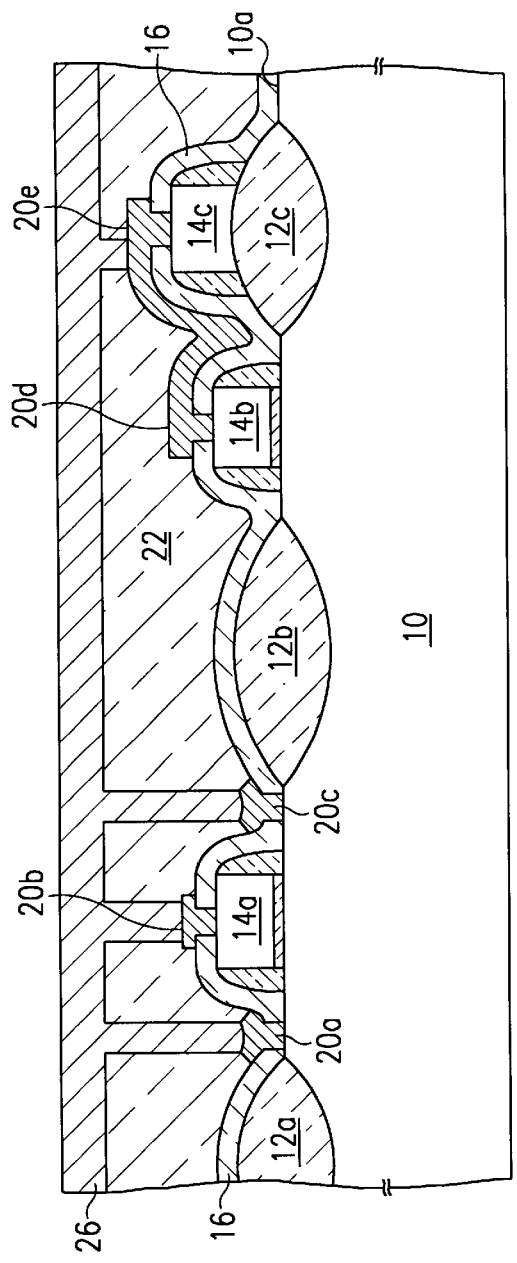
FIG. 1c illustrates a cross-sectional view of the prior art semiconductor substrate of FIG. 1b and further including a metal layer with contacts to poly-2 devices underlying the planar dielectric layer.
Figure 2A:
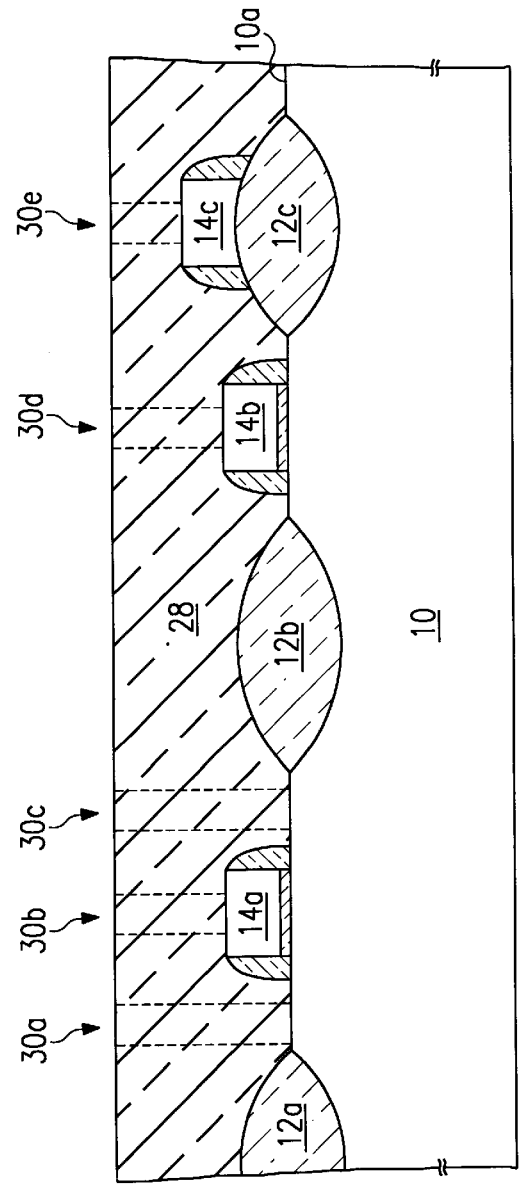
FIG. 2a illustrates a cross-sectional view of the preferred semiconductor substrate of the present invention having poly-1 devices formed on the surface of the substrate as well as a planarized dielectric layer overlying the poly-1 devices.
Figure 2B:
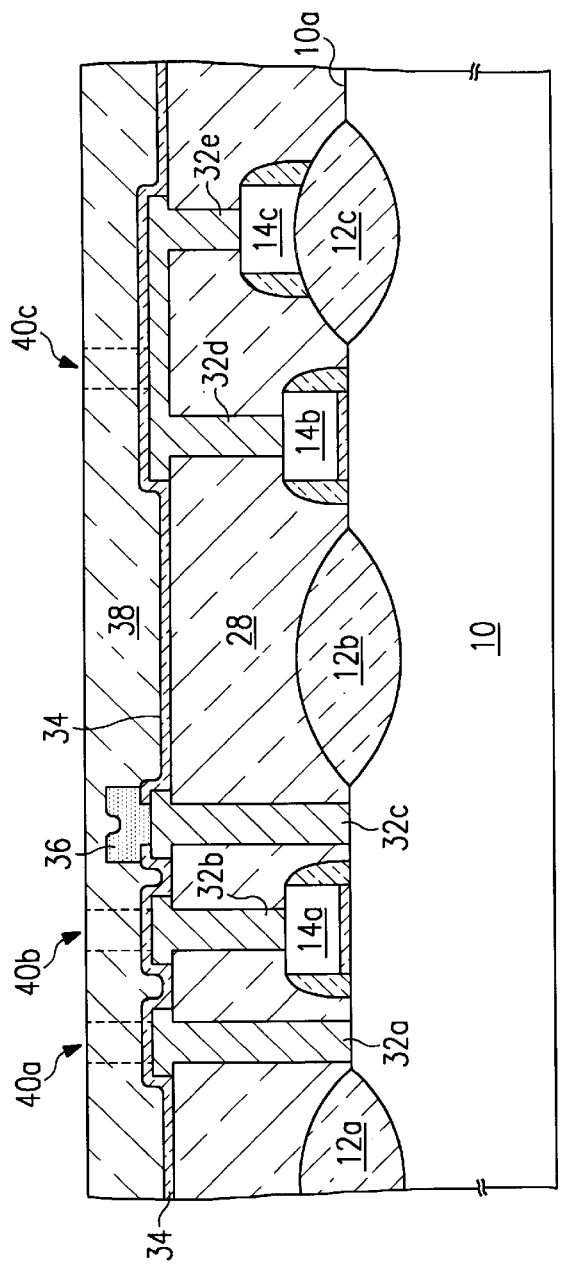
FIG. 2b illustrates a cross-sectional view of the inventive semiconductor substrate of FIG. 2a and further including poly-2 and poly-3 devices, as well as an overlying planar dielectric layer.
Figure 2C:
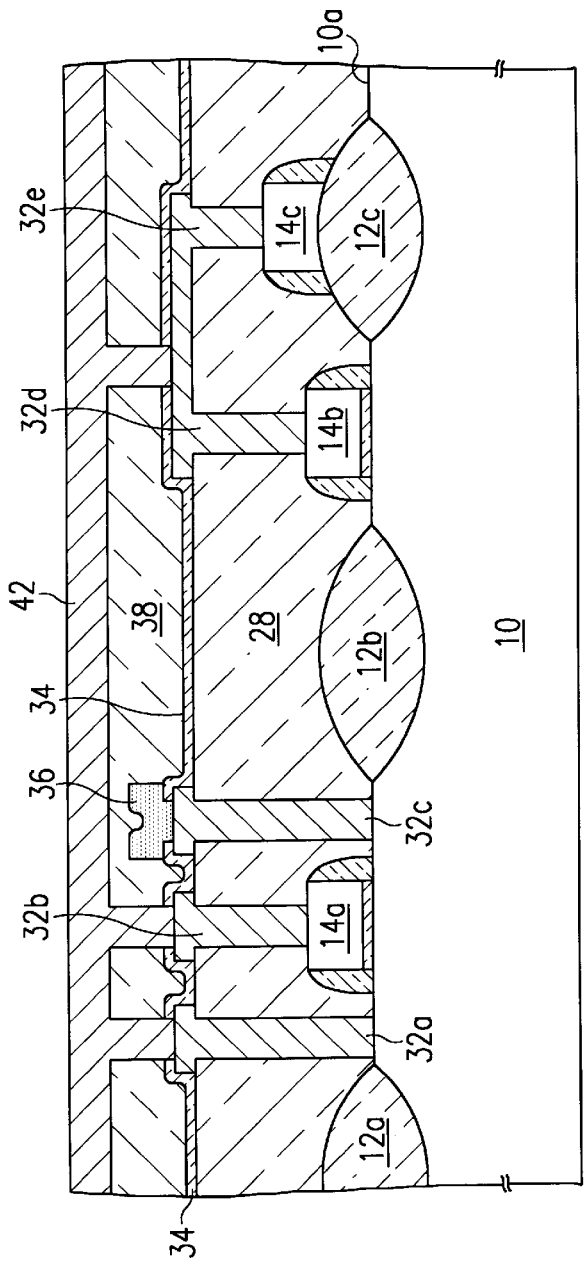
FIG. 2c illustrates a cross-sectional view of the inventive semiconductor substrate of FIG. 2b and further including a metalized layer with contacts extending downward to poly-2 devices.

The preferred embodiment of the present invention and its advantages are best understood by referring to FIGS. 1a through 2c of the drawings, like numerals being used for like and corresponding parts of the various drawings. The cross-sections of FIGS. 2a through 2c illustrate the preferred embodiment as a portion of an overall process flow for fabricating an integrated circuit. One skilled in the art will recognize, however, that the following partial process flow may be applied in the fabrication of many types of integrated circuits, in which the full process flow will include many other process steps known in the art. For example, in the preferred embodiment, the eventual structure shown by FIGS. 2a through 2c is incorporated into an SRAM integrated circuit and, therefore, various other steps relating to the fabrication of SRAMs will be used along with the steps described below. Lastly, before proceeding, note that the Figures herein are not necessarily shown to scale, but use dimensions to highlight certain aspects as better appreciated below.

FIG. 2a illustrates a cross-sectional view of a semiconductor substrate having poly-1 structures formed on a surface of the substrate as well as an overlying planarized dielectric layer, in accordance with a preferred embodiment of the present invention. Certain components shown in FIG. 2a are the same as in the prior art FIG. 1a and, thus, for only those components, the same reference numerals are carried forward from FIG. 1a to FIG. 2a. These same components are used again in FIG. 2a (and FIGS. 2b through 2c) to contrast the invention to the prior art, but in no manner are intended to limit the scope of the present invention. Indeed, the invention as herein described could apply to a multitude of alternative semiconductor configurations. The above stated, the common features of FIG. 2a and 1a therefore include a semiconductor substrate 10 with an upper surface 10a. In addition, field oxide regions 12a through 12c are formed at surface 10a. Still further, transistor gates 14a and 14b, as well as a conductor 14c are formed using a poly-1 level formation process.

In sharp contrast to FIG. 1a, FIG. 2a includes a planar dielectric layer 28 formed immediately after the poly-1 devices (i.e., items 14a through 14c). Thus, in the location where the prior art used a conformal dielectric layer which is relatively thin, the present invention implements a planar dielectric layer which is relatively thick. As detailed below, the formation of dielectric layer 28 at this early stage in the fabrication process provides distinct advantages over prior art structures. Dielectric layer 28 is a globally formed layer, preferably forming an oxide film. The oxide film is preferably formed first by a chemical vapor deposition, which may be either a low pressure or an atmospheric pressure chemical vapor deposition. Thereafter, the surface of the deposited oxide film is ground away, typically using a slurry applied with a pad pressure and at a particular polishing rate, each of which is known in the art. Preferably, dielectric layer 28 is on the order of 10,000 angstroms in thickness. After dielectric layer 28 is formed, holes are formed through that layer using standard masking and etching techniques. The locations of these holes are shown using vertical dashed lines in layer 28, and are numbered 30a through 30e. Holes 30a through 30e are commonly on the order of 0.5 microns in diameter.

FIG. 2b illustrates electrical contacts formed through planarized dielectric layer 28 and formed at the poly-2 level of fabrication. Specifically, contacts 32a through 32e are formed first by depositing a conductive layer and second by selectively etching that layer to form the desired size and shape of the contacts. As in the prior art, a blanket poly-2 layer is formed using a conformal chemical vapor deposition ("CVD") technique with a thickness selected to fill the largest diameter among holes 30a through 30e (best seen in FIG. 1). Thereafter, the CVD layer is patterned and etched using known techniques. With reference to the particular contacts, FIG. 2b includes poly-2 contacts 32a through 32e formed in holes 30a through 30e, respectively, from FIG. 2a. Contacts 30a through 30e form electrical points to be contacted by subsequent conductive layers. Again, poly-2 may be used to form landing pads as well as other types of contacts. Note further that contacts 32d and 32e are also connected to one another, thereby forming a local interconnect.

Continuing with FIG. 2b, a conformal dielectric layer 34 is formed over the poly-2 devices 32a through 32e. Dielectric layer 34 is formed as an oxide and is preferably 2,000 angstroms in thickness. Moreover, dielectric layer 34 thereafter permits poly-3 level devices to be formed over that layer. As an example, FIG. 2b further depicts a poly-3 resistor 36 formed overlying poly-2 contact 32c. Note that resistor 36 contacts poly-2 contact 32c though a hole formed through dielectric later 34. Although not shown, an additional conformal dielectric layer could be formed for a structure having poly-4 components, but for simplification such devices are not detailed herein.

After the formation of the final polysilicon layer (i.e., poly-3 in the illustration of FIG. 2b), a final planar dielectric layer 38 is formed. Planar dielectric layer 38 is formed in the same general manner as planar dielectric layer 28, but the former is preferably much thinner; for example, planar dielectric layer 38 is preferably on the order of 4,000 angstroms in thickness.

After dielectric layer 38 is formed, holes are formed through that layer as well as dielectric layer 34, again using standard masking and etching techniques. For purposes of illustration, the locations of these holes are shown using vertical dashed lines in layers 34 and 38, and are numbered 40a through 40c. Holes 40a through 40c are commonly on the order of 0.5 microns in diameter. Note that the length of holes 40a through 40c extend no further than to poly-2 structures (e.g., contact 32a). Note also that the vertical height of the poly-2 structures in FIG. 2b is much greater than the height of the poly-2 structures in prior art FIG. 1b. Consequently, the length of holes 40a through 40c need only span a much shorter distance, that is, the distance from the upper surface of dielectric layer 38 to the upper surface of the corresponding poly-2 structure. This contrast is appreciated further with respect to the following discussion of FIG. 2c.

FIG. 2c illustrates the structure of FIG. 2b following the addition of electrical contacts through dielectric layers 38 and 34. Particularly, holes 40a through 40c are preferably filled by a metal layer 42 so electrical contact may be made to the component underlying the respective holes. In the preferred embodiment, metal layer 42 is a conventional barrier metal and could be aluminum to further reduce sheet resistance. Further, layer 42 is preferably on the order of 5,000 angstroms in thickness.

Given FIG. 2c, and further comparing it to the prior art shown in FIG. 1c, one skilled in the art will recognize that the present invention includes a planarized insulating layer 28 which is formed earlier in the fabrication process as compared to the prior art. As a result, numerous benefits are realized. As one example, the overall structure is relatively planar once poly-2 structures devices are completed. As another example, the vertically downward extensions of the interconnect metal layer 42 do not extend as far into the device as in the prior art metal layer 26 and, therefore, are less prone to the stringent requirements for filling holes with high aspect ratios and complying with stress requirements for barrier integrity. As a related benefit, the aspect ratio of the holes in which metal must extend (i.e., 40a through 40c) is much smaller and, thus, the design considerations are simplified. As yet another example, in many implementations, the vertically downward extensions of the interconnect metal layer 42 are the same length. Still further, the components of differing lengths (e.g., contacts 32a through 32e) are created earlier in the fabrication process.

From the above, therefore, it may be appreciated that the preferred embodiment of the present invention provide numerous benefits and objects as set forth above. Further, while the present invention has been described in detail, various substitutions, modifications or alterations have been described which demonstrate its flexibility and inventive scope. In addition, still other such variations could be made to the descriptions set forth above. For example, while the invention is described by way of example as an SRAM, the present invention could apply to other types of memories, and even integrated circuits without data storage capabilities. As another example, various additional layers (e.g., polysilicon and/or dielectric) could be included between the planarized dielectric layer and the eventual upper metal layer. Still other changes may be achieved by a person skilled in the art without departing from the invention which is defined by the following claims.

What is claimed is:

1. A method of forming a portion of a semiconductor integrated circuit on a semiconductor substrate, comprising the steps of:

forming a first polysilicon layer over said semiconductor substrate;

patterning said first polysilicon layer to form a plurality of first conductive structures, at least said first conductive structures creating an even surface on said substrate;

forming a first dielectric layer on said uneven surface, said first dielectric layer having an upper planar surface and having a lower surface facing said semiconductor substrate and said plurality of first conductive structures;

forming a second polysilicon layer overlying said first dielectric layer;

patterning said second polysilicon layer to form a plurality of second conductive structures having extensions that extend through holes in said first dielectric layer to contact integrated circuit features thereunder;

forming a conformal second dielectric layer over said plurality of second conductive structures and said first dielectric layer, forming a third dielectric layer over said conformal second dielectric layer, said third dielectric layer having an upper planar surface and having a lower surface; and forming a metallic layer over said third dielectric layer, said metallic layer having extensions that extend through holes in said third dielectric layer and said conformal second dielectric layer to contact at least some of said second conductive structures.

2. The method of claim 1, and further comprising forming a third patterned polysilicon layer at least partially over said conformal second dielectric layer to form at least one third conductive structure.

3. The method of claim 2 wherein the lower surface of said third dielectric layer faces said at least one third conductive structure.

4. The method of claim 3 wherein said step of forming a metallic layer comprises forming a metallic layer having a lower surface contacting said upper planar surface of said third dielectric layer.

5. The method of claim 3 wherein said step of forming said first dielectric layer comprises forming a dielectric layer having a thickness of approximately 10,000 angstroms, and wherein said step of forming said third dielectric layer comprises forming a dielectric layer having a thickness of approximately 4,000 angstroms.

6. The method of claim 1 wherein said extensions of said metallic layer extend less than the distance to said upper planar surface of said first dielectric layer.

7. The method of claim 1 wherein said step of forming a first dielectric layer comprises forming a dielectric layer having a thickness of approximately 10,000 angstroms.

8. A method of forming a portion of a semiconductor integrated circuit on a semiconductor substrate, comprising the steps of:

forming first and second pattern polysilicon structures from respective first and second polysilicon layers over said semiconductor substrate said second polysilicon structures having extensions to contact at least some of said first polysilicon structures and least some regions of said substrate, at least said first patterned polysilicon structures creating an uneven surface on said substrate;

forming a first dielectric layer on said uneven surface, said first dielectric having an upper planar surface and having a lower surface toward said semiconductor substrate to vertically separate said first and second polysilicon structures, with said extensions between said first and second polysilicon structures extending therethrough;

forming a conformal second dielectric layer over said polysilicon structures in said first dielectric layer;

forming a third dielectric layer over said conformal second dielectric layer; and forming a metallic layer over said third dielectric layer with a plurality of extensions extending through said third dielectric layer and said conformal second dielectric layer toward said semiconductor substrate to contact at least some of said polysilicon structures, said extensions extending no farther in linear distance than said upper planar surface of said first dielectric layer.

9. The method of claim 8 after the step of forming the conformal second dielectric layer and before the step of forming the third dielectric layer further comprising the steps of:

forming third polysilicon structures from a third polysilicon layer having at least a portion of a lower surface in contact with an upper planar surface of said conformal second dielectric layer; and wherein said extensions of said metallic layer extend no farther than to the upper surface of said first dielectric layer.

10. An integrated circuit having a semiconductor substrate, comprising:

a plurality of first conductor structures patterned from a first polysilicon layer overlying said semiconductor substrate, at least said first conductive structures creating an uneven surface on said substrate;

a first dielectric layer having an upper planar surface and having a lower surface on said uneven surface;

a plurality of second conductive structures patterned from a second polysilicon layer overlying said first dielectric layer;

a conformal second dielectric layer over said second conductive structures:

a third dielectric layer over said conformal second dielectric layer; and a metallic layer over said third dielectric layer, having extensions that extend through said third dielectric layer and said conformal second dielectric layer to contact at least some of said second conductive structures.

11. The integrated circuit of claim 10 further comprising at least one third conductive structure from a third polysilicon layer at least partially overlying and in contact with said conformal second dielectric layer.

12. The integrated circuit of claim 11 further comprising said third dielectric layer having an upper planar surface and having a lower surface facing said third conductive structure.

13. The integrated circuit of claim 12 wherein said metallic layer has a lower surface contacting the upper planar surface of said third dielectric layer.

14. The integrated circuit of claim 12 wherein said first dielectric layer has a thickness of approximately 10,000 angstroms, and wherein said third dielectric layer has a thickness of approximately 4,000 angstroms.

15. The integrated circuit of claim 10 further comprising a third dielectric layer having an upper planar surface and having a lower surface facing said plurality of second conductive structures.

16. The integrated circuit of claim 15 wherein said metallic layer has a lower surface contacting said upper planar surface of said third dielectric layer.

17. The integrated circuit of claim 10 wherein said metallic layer comprises a plurality of conductor extensions extending toward said semiconductor substrate less than the distance to said upper planar surface of said first dielectric layer.

18. The integrated circuit of claim 10 wherein said first dielectric layer has a thickness of approximately 10,000 angstroms.

19. An integrated circuit having a semiconductor substrate, comprising:

a plurality of conductive polysilicon structures over said semiconductor substrate, ones of said plurality of conductive polysilicon structures creating an even surface on said substrate;

a first dielectric layer on said uneven surface, said first dielectric having an upper planar surface and having a lower surface facing said semiconductor substrate, vertically separating two of said polysilicon structures;

a conformal second dielectric layer over said polysilicon structures and said first dielectric layer; and a metallic layer over said conformal second dielectric layer and having a plurality of conductor extensions extending through said conformal second dielectric layer toward said semiconductor substrate for a distance no greater than the distance to said upper planar surface and said first dielectric layer.

* * * * *